United States Patent [19]
Testa

[11] Patent Number: 5,260,892
[45] Date of Patent: Nov. 9, 1993

[54] HIGH SPEED ELECTRICAL SIGNAL INTERCONNECT STRUCTURE

[75] Inventor: James Testa, Mountain View, Calif.

[73] Assignee: Sun Microsystems, Inc., Mountain View, Calif.

[21] Appl. No.: 795,699

[22] Filed: Nov. 21, 1991

[51] Int. Cl.⁵ .................. H01R 13/00; H05K 7/20; G11C 13/00; G11C 5/00
[52] U.S. Cl. .................... 365/63; 439/326; 371/11.1; 361/684; 361/783
[58] Field of Search ............ 365/63; 439/326; 361/386; 371/11.1

[56] References Cited

U.S. PATENT DOCUMENTS

| | | | |
|---|---|---|---|
| 4,262,340 | 4/1981 | Sasaki et al. | 365/154 |
| 4,651,416 | 3/1987 | DePaul | 29/174 |
| 4,727,513 | 2/1988 | Clayton | 365/52 |
| 4,850,892 | 7/1989 | Clayton et al. | 439/326 |
| 4,879,631 | 11/1989 | Johnson et al. | 361/386 |
| 4,882,700 | 11/1989 | Mauritz et al. | 365/51 |
| 4,884,237 | 11/1989 | Mueller et al. | 365/63 |
| 4,891,789 | 1/1990 | Quattrini et al. | 361/409 |
| 4,990,107 | 2/1991 | Fortuna | 439/637 |
| 4,992,849 | 2/1991 | Corbett et al. | 357/72 |
| 4,992,850 | 2/1991 | Corbett et al. | 357/72 |
| 5,026,297 | 6/1991 | Krehbiel | 439/326 |
| 5,051,994 | 9/1991 | Bluethman et al. | 371/11.1 |
| 5,094,624 | 3/1992 | Bakke et al. | 439/326 |
| 5,112,242 | 5/1992 | Choy et al. | 439/326 |
| 5,126,910 | 6/1992 | Windsor et al. | 361/42 |
| 5,138,434 | 8/1992 | Wood et al. | 357/74 |
| 5,145,396 | 9/1992 | Yeung | 439/326 |
| 5,157,635 | 10/1992 | Ellis et al. | 365/230 |
| 5,161,995 | 11/1992 | Bakke et al. | 439/326 |
| 5,162,979 | 11/1992 | Anzelone et al. | 361/415 |
| 5,167,517 | 12/1992 | Long | 439/160 |

FOREIGN PATENT DOCUMENTS 0398188 11/1990 European Pat. Off. .
1041535 9/1954 Netherlands .

OTHER PUBLICATIONS

IBM Technical Disclosure Bulletin, vol. 21, No. 2, Jul. 1978, in Armonk, New York, U.S., pp. 585–586, Author: Doo, et al., Entitled: High Performance Package For Memory.

*Primary Examiner*—Eugene R. LaRoche
*Assistant Examiner*—Viet Q. Nguyen
*Attorney, Agent, or Firm*—Blakely Sokoloff Taylor & Zafman

[57] ABSTRACT

An improved high speed, high density Dynamic Random Access Memory (DRAM) electrical signal interconnect structure which has particular application to computer systems which employ Single In-line Memory Modules (SIMMs). The structure contains an on-board buffer for driving time critical signals from a single source and further includes innovative signal trace routing having approximately equivalent minimum distance signal line lengths and vias to memory modules on the front and back surfaces of the circuit board resulting in a high speed, high density SIMM with clean rising/falling signal edges.

20 Claims, 5 Drawing Sheets

HIGH SPEED ELECTRICAL SIGNAL INTERCONNECT STRUCTURE

BACKGROUND OF THE INVENTION

1. Field of the Invention

The present invention relates to a high speed electrical signal interconnect structure for transferring data, and in particular, the present invention relates to an optimum interconnect structure among multiple Dynamic Random Access Memory devices in order to accommodate high speed signals.

2. Art Background

It is common to build a computer that includes one or more small circuit boards designed to accommodate surface-mount memory chips. These so called "Single In-line Memory Modules" (SIMMs) were developed to use less board space and are more compact than more conventional memory-mounting hardware. A SIMM may be comprised of one of several different types of random access memory (RAM). RAM is semiconductor-based memory that can be read and written by the microprocessor or other hardware devices. These storage locations can be accessed in any order. While the various types of Read Only Memory (ROM) are capable of random access, the term "RAM", is generally understood to refer to volatile memory, which can be written as well as read. Examples of types of RAM include: Dynamic RAM (DRAM), Static RAM (SRAM) and Video RAM (VRAM).

DRAMs store information in integrated circuits that contain capacitors. Because capacitors lose their charge over time, DRAMs must include logic to "refresh" (recharge) the RAM chips periodically. While a DRAM is being refreshed, it cannot be read by the processor; if the processor must read the RAM while it is being refreshed, one or more wait states occur. Because their internal circuitry is simple, DRAMs are more commonly used than SRAMs, even though they are slower. A DRAM can hold approximately four times as much data per area as a SRAM of the same complexity.

SRAM is based on the logic circuit known as the flip-flop, which retains the information stored as long as there is enough power to run the device. Because SRAMs are more expensive than DRAMS, SRAMs are usually reserved for special fast memory subsystems called caches, in which frequently used data values are stored for quick access.

VRAM is a special type of DRAM used in high-speed video applications. With conventional DRAM, both the processor and the video circuitry must access RAM by sharing the same control pins on the RAM chips. VRAM provides separate pins for the processor and the video circuitry. The processor accesses the VRAM in a manner almost identical to that for DRAM, but the video circuitry is provided with a special "back door" to the VRAM. This back door lets the video circuitry access the memory bit by bit (serially), which is more appropriate for transferring pixels to the screen than is the parallel access provided by conventional DRAM.

As computers have become faster and more powerful, it has become desirable to increase the amount of RAM available on an individual SIMM. However it is not the question of simply increasing the number of RAM chips on a SIMM. Every RAM chip added onto the SIMM increases the load seen by the bus driver of the computer system. A driver is a hardware device that controls or regulates another device. A line driver, for example, boosts signals transmitted over a communications line, and a bus driver amplifies and regulates signals transmitted over a bus (data pathway) thereby providing a strong signal across multiple lines concurrently. Doubling or quadrupling the number of RAM chips on a SIMM will result in a corresponding increase in the SIMM load seen by the bus driver. Such an increase in load would exceed the capability of the bus driver.

While it is common in the art for SIMM boards to have a plurality of DRAM modules on a SIMM, the driver is typically located on a separate board with a significantly long interconnect between the driver on the board and the memory modules located on the SIMM. Most SIMMs only contain memory chips, thereby relying on the bus driver to supply the signals to the memory chips. Some prior art SIMM boards have an on-board driver for each memory module. However, simply adding on-board drivers will not maintain the signal integrity requirements necessary in the case of a high density, high speed memory module.

Signal integrity is important when at high signal speeds as each RAM chip must receive the signals concurrently with each other RAM chip on the SIMM. Synchronizing signals so that each RAM chip receives its signal concurrently with every other RAM chip becomes increasingly difficult as the density of the SIMM increases because there are simply more chips to receive the signal and hence more possibilities for one of the chips to lose synch. This increased opportunity for synchronization problems is further compounded by the closer tolerances demanded by the high speed signals. At high speeds, signals change more rapidly, more possible transitions in a given time interval occur, and each possible transition provides a chance for loss of synchronization. Moreover, each signal transition must be accomplished in a shorter time providing each RAM chip a very small amount of time to correctly respond to the signal.

For the high operating speeds of the present state of the art, using multiple on-board drivers will not provide an adequate high speed interconnect necessary to take advantage of the more sophisticated access times. The close tolerances of high speed signals would require that the multiple drivers operate in a virtually identical manner to guarantee that each RAM chip receives its signal concurrently with every other RAM chip. Yet each driving chip manufactured varies slightly in its operating characteristics from other driving chips of the same type. For the reasons outlined above, the tolerable margin of error when selecting matching driving chips decreases as the operating speed of the SIMM increases. This matching problem is further compounded as the number of drivers placed on the SIMM board increases because each additional driver must match every driver already selected.

Just as the bus driver may not be powerful enough to drive the large number of chips on a high density SIMM, a single on-board driver also may not have the power to drive such a large number of chips. Moreover, even if a driving chip of sufficient strength is used, increasing the number, and hence, the density of the RAM chips on the SIMM board necessarily increases the length of the signal paths used to connect the chips together. If no on-board driver, or only a single on-board driver, is used, each RAM chip must be connected to a single signal source. The physical size of each individual RAM chip forces the chips to be disbursed across the SIMM board in such a way that longer lead lengths cannot be avoided. Increased lead lengths cause reflection signal noise which can cause glitches (non-monotonic wave forms). Non-monotonic waveforms appear as multiple rising edges, where only one rising edge was desired. These glitches can result in the wrong data being stored in, or retrieved from, the memory thereby destroying the reliability of the computer's computations.

Referring now to FIG. 1, a typical high speed digital signal is demonstrated. The square wave 1 represents an ideal signal. Voltage on the line may be in either of two states (low or high). These states may be thought of as corresponding to two arbitrary opposite states which have been chosen for their suitability based upon the particular function of the signal. Representative naming conventions include: on/off, zero(0)/one(1), Read/-Write. The speed of the signal is judged by the number of possible times per second that the signal can transition from one state to another. Thus for a typical high speed signal with a frequency of 40 Megahertz, the signal would have a maximum of 40 million high/low states per second. Each state would last 25 nanoseconds (billionths of a second).

Superimposed upon the square wave is a more representative "clean" (low-noise) signal 2. It is impossible for the signal to transition instantaneously from the low to high states (or back to low again) as is represented in the step function of the square wave. In reality, there is a rise and fall time, that results in the sloping leading edge 3 and trailing edge 4 demonstrated here. In the present art, for a 40 Megahertz system, this rise/fall time is approximately 2 nanoseconds.

Referring now to FIG. 2, one finds a simplified representative noisy signal 6. When the wave hits an impedance discontinuity, i.e. a branch in the printed circuit board trace, the voltage of the wave is split between the branches producing a step. The waveforms flowing down the branches do not reach the maximum voltage, Vo, until the reflections from the branches return. (A good analogy is an ocean wave flowing up two creeks). The voltage before the discontinuity, Vo, will divide into two voltages Vo/X1 in the first branch and Vo/X2 in the second branch (where X1 and X2 are both greater than one). If the reflections do not return within the risetime of the signal, the Vo/X1 or the Vo/X2 voltage is observable and thus a glitch is formed.

The time that it takes for the signal to reflect back is a function of the speed of light, the length of travel of the signal along its path and the dielectric constant of the board. For a fixed dielectric constant, the relationship is such that the longer the length of the signal path, the longer the delay to the inflection point.

If the signal has several terminal points, then there will be as many inflection points as there are different length paths to the terminal points and combination of inflection points may produce false triggers. For present art, low density, slow speed SIMMs, the connection distances are short enough so that false triggers do not occur. This is because the wave returns during the risetime period of the signal.

SUMMARY OF THE INVENTION

Therefore it is an object of the present invention to provide a high speed, high density memory module with clean rising/falling signal edges heretofore unknown in the prior art.

It is further an object of the present invention to provide a high speed interconnect structure which maintains the signal integrity so required.

A high speed, high density Dynamic Random Access Memory (DRAM) Single In-line Memory Module (SIMM) is disclosed which contains an on-board buffer for driving time critical signals from a single source and further includes innovative signal trace routing having closely equivalent minimum signal line lengths and vias to memory modules on the front and back surfaces of the circuit board resulting in a high speed, high density SIMM with clean rising/falling signal edges.

Time critical signals from the memory controller of a computer RAM system are sent to a SIMM. Using the teachings of the present invention, a driving chip, located in the center of the printed circuit board of the SIMM, acts as a buffer and drives various signals to the DRAM chips populating the board. Specifically, the driver drives the Column Address Strobe (CAS), Row Address Strobe (RAS) and Write Enable (WE) signals.

The present invention further includes symmetric, minimum distance, signal line traces that electrically connect the driving chip to clusters of DRAM chips. The DRAM chip clusters populate both sides of the printed circuit board with DRAM chips on one side of the board having connector pins located on the chips such that the chips are mirror images of the DRAM chips on the opposite side of the board. Time critical signals are delivered to input pins of DRAM chips on the side of the printed circuit board opposite the driving chip by vias that extend through the multiple layers of the printed circuit board from the corresponding signal input pins of each chip's corresponding mirror image chip.

In addition, the lengths of the signal line traces are decreased sufficiently such that signal reflections harmlessly occur during the signal transitions. The DRAMS on the opposite side of the board are mirror images of those on the front side. Thus, only one set of traces is needed to connect the front side DRAMs as the back side is connected with vias. This cuts the trace capacitance in half, since the back side DRAMS do not have a separate set of traces routed from the driving chip.

Accordingly, the present invention provides a high speed, high density SIMM apparatus with clean rising-/falling signal edges heretofore unknown in the prior art.

DETAILED DESCRIPTION OF THE INVENTION

A high speed, high density Dynamic Random Access Memory (DRAM) Single In-line Memory Module (SIMM) which contains an on-board buffer for driving time critical signals from a single source and further includes innovative signal trace routing having closely equivalent minimum signal line lengths and vias to memory modules on the front and back surfaces of the circuit board resulting in a high speed, high density memory SIMM with clean rising/falling signal edges is disclosed. In the following description, for purposes of explanation, specific numbers, bytes, registers, addresses, times, signals, and data message formats, etc. are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

Figure 1:
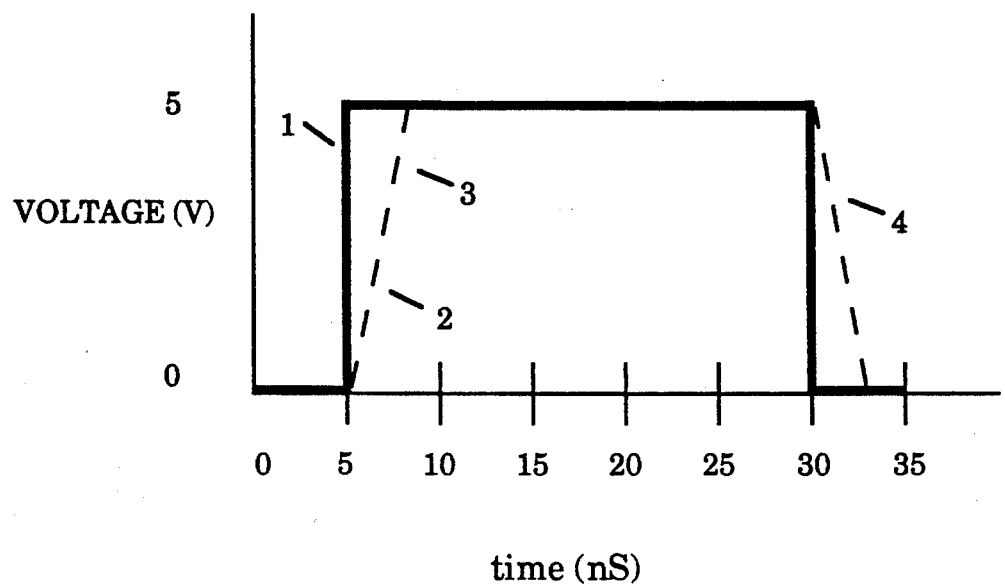
FIG. 1 illustrates the risetime delay in an actual versus theoretical signal.
Figure 2:
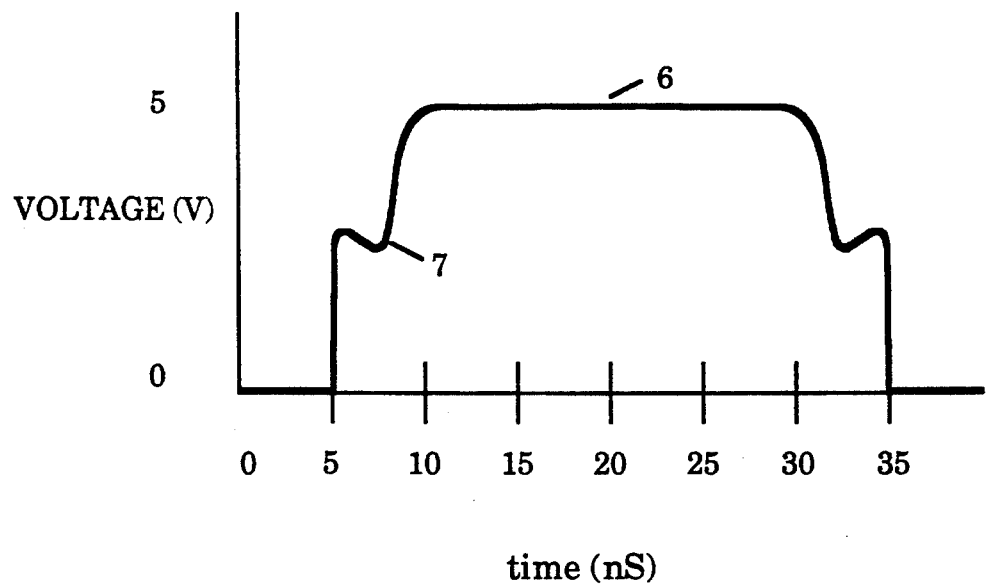
FIG. 2 illustrates a signal that includes a line delay reflection glitch.
Figure 3:
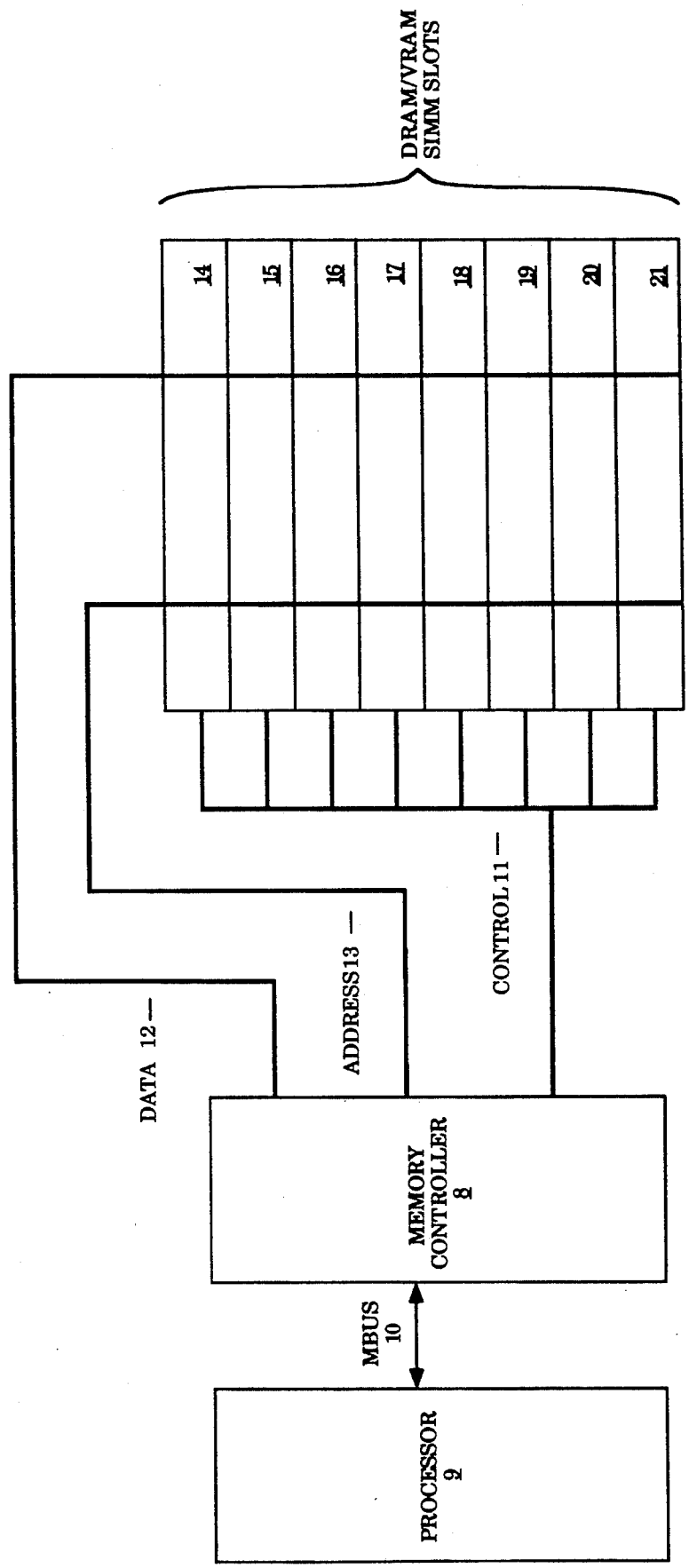
FIG. 3 illustrates the RAM system environment that utilizes the present invention.

Referring to FIG. 3, the present invention has been designed to operate in a RAM system such as is described by this diagram. As shown, address and data signals are carried between the memory controller 8 and processor 9 by the 64 bit bus 10. The memory controller 8 then controls the flow of Control 11 (3 bit), Data 12 (144 bit) and Address 13 (11 bit) signals to each of eight DRAM/VRAM SIMM slots 14–21. Each of the eight SIMM slots is a hardware connector into which VRAM or DRAM SIMMs can be inserted. The present invention can be used by inserting it into any of the eight SIMM slots.

Figure 4:
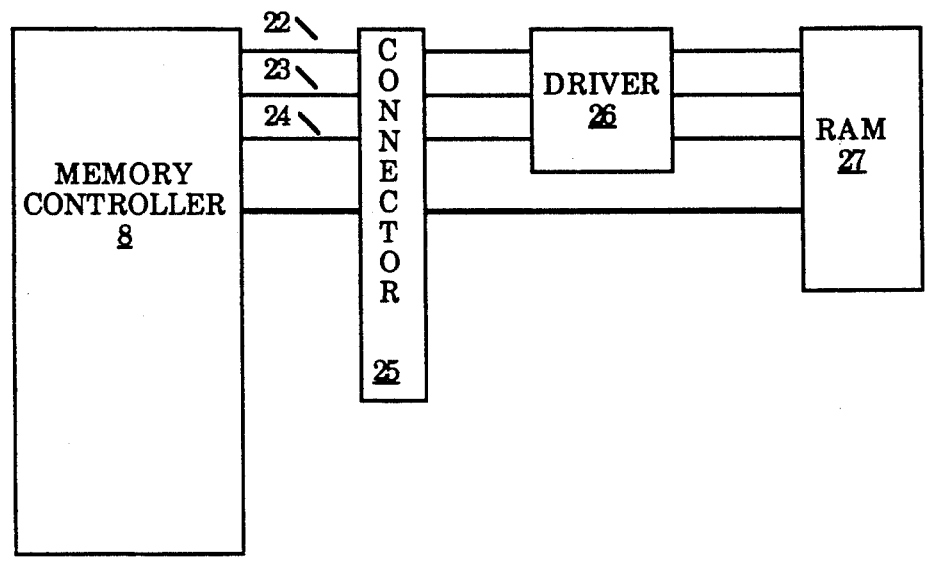
FIG. 4 illustrates a Single In-line Memory Module utilizing the teachings of the present invention.

Referring now to FIG. 4, the present invention uses a single driving chip on the SIMM board to provide various time critical signals to the DRAM modules on the SIMM. The driving chip best mode implementation of the present invention is the Texas Instruments, Inc. model number 74ABT16244, however it can be appreciated by one skilled in the art that another driver may also be used. Column Address Strobe (CAS) 22, Row Address Strobe (RAS) 23 and Write Enable (WE) 24 signals come through the SIMM connector 25 from the Memory Controller 8 to the on-board driving chip 26. The time critical signals are then routed from the driver 26 to each of the DRAM chips 27. Less time critical signals, including data and address, are carried directly from the SIMM connector 25 to the DRAM chips 27. However, it will be appreciated by one skilled in the art that these less time critical signals could also be driven by an on-board driver.

Figure 5:
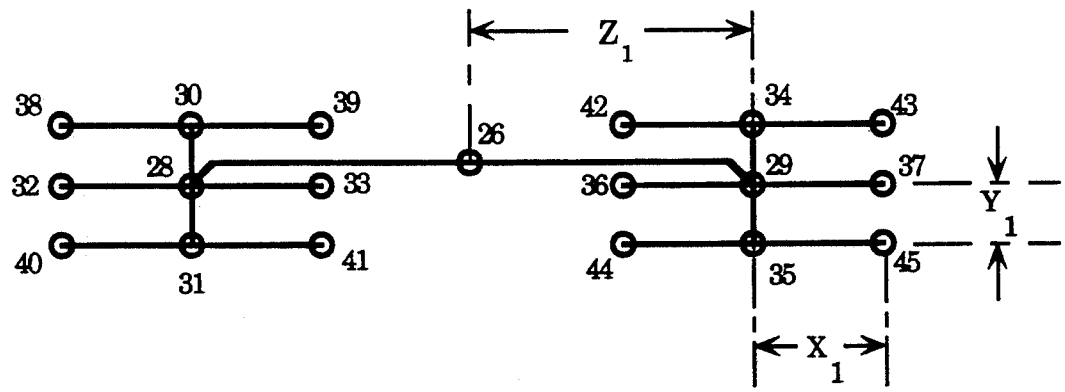
FIG. 5 illustrates a minimum trace length star cluster configuration of the present invention.

Referring now to FIG. 5, the topology of the present invention is disclosed. The driving chip 26 is located in the center of eighteen DRAM chips 28–45 which are positioned in a symmetric pattern. The driving chip is connected electrically to the two center DRAM chips 28 and 29. The two center DRAM chips 28 and 29 are connected electrically in the vertical direction to the two closest DRAM chips 30–33 and 34–37. Additionally, each DRAM chip 28–45 is connected electrically in the horizontal direction to its closest neighbor DRAM chip 28–45. In the best mode implementation of the present invention, the distances X1, Y1 and Z1 correspond approximately to one inch, one-half inch and two inches, respectively.

Figure 6:
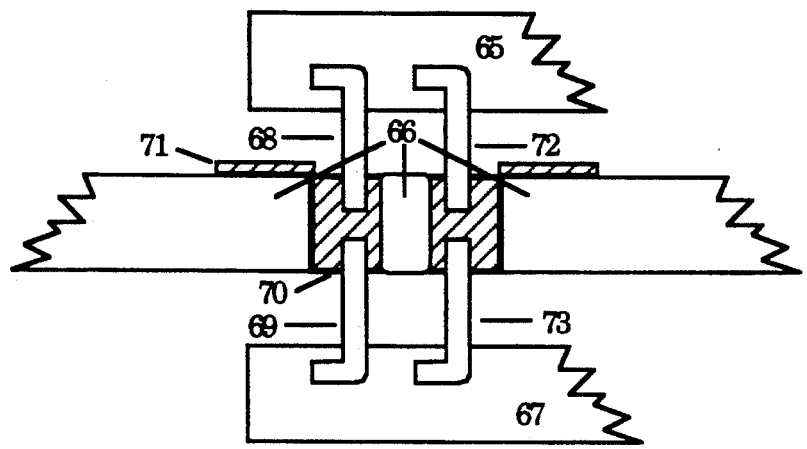
FIG. 6 illustrates the mounting of a RAM chip and its mirror image directly opposite each other on opposite sides of a circuit board and electrical connection of the RAM chips through the board.

Referring now to FIG. 6, a method for doubling the density of RAM chips without significantly increasing the signal trace length is demonstrated. A RAM chip 65 is mounted to a double sided circuit board 66 with a mirror image RAM chip 67 mounted on the other side. The RAM chip 65 is identical to the mirror image RAM chip 67 except that the leads of the RAM chip are mirror images of the leads of the mirror image RAM chip. That is to say, in this example, looking from the top of the chips, the front left pin 68 of the RAM chip 65 serves the same electrical function as the front right pin 69 of the mirror image RAM chip 67. The RAM chip 65 and its mirror image RAM chip 67 are mounted opposite each other on the circuit board 66 in such a manner that the front left pin 68 of the RAM chip 65 is connected electrically to the front right pin 69 of the mirror image RAM chip 67 through the circuit board 66 by a via 70 which is also connected electrically to a signal trace 71 which serves both pins. Similarly, the second pin from the front 72 on the left side of the RAM chip 65 corresponds to the second pin from the front 73 on the right side of the mirror image RAM chip 67, etc.

The DRAM chip density can be increased by a factor of four over the prior art by grouping the DRAMs together into four, three chip-by-three chip lattice matrix, symmetric star clusters. Two of these clusters are then placed on either side of the SIMM board with the driving chip located in the center of two clusters on one side of the board. The DRAM chips on one side of the board are mirror images of the DRAM chips on the other side. This permits the DRAM chips to be mounted on the board so that the pins from one chip reside directly through the board from the corresponding pins of a mirror image DRAM chip. Minimum distance signal traces carry time critical signals from the driver to the signal input pins of the DRAM chips on the driver side of the board. These time critical signals are also conducted to the signal input pins of DRAM chips on the opposite side of the board by way of vias which pass through the multiple layers of the SIMM printed circuit board.

By connecting the DRAM chips to the on-board driving chip in this manner, the trace length to each of the DRAM chips (stub length) is minimized thereby decreasing the trace capacitance. Also, connecting each of the DRAM chips on the driver side of the board using vias to its corresponding mirror image DRAM chip on the opposite side of the board results in a further decrease in capacitance due to the elimination of traces on the opposite side of the board. Furthermore, because the topology of the routing to the RAMs is as symmetric as possible, the reflections will all return to the driver at closely the same time, which also contributes to the smoothness of the wave. Since the trace length stubs are quite short the reflections from the stub ends return within the risetime of the signal producing "clean" waveforms.

Figure 7:
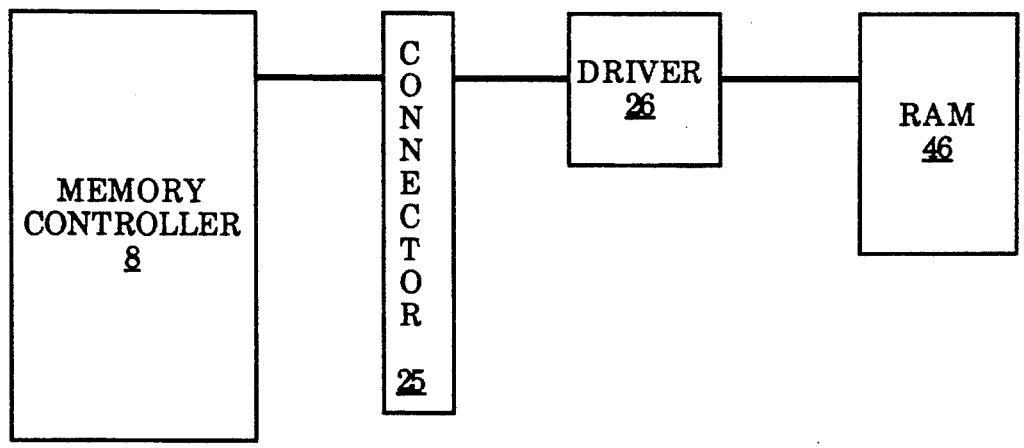
FIG. 7 illustrates an alternate embodiment of a Single In-line Memory Module utilizing the teachings of the present invention.

Referring now to FIG. 7, an alternate embodiment of the present invention uses a single driving chip on the SIMM board to provide various time critical signals to the VRAM modules on the SIMM. Control, Data and Address signals, come through the SIMM connector 25 from the Memory Controller 8 to the on-board driver 26. These signals are then routed from the driver 26 to each of the VRAM chips 46.

Figure 8:
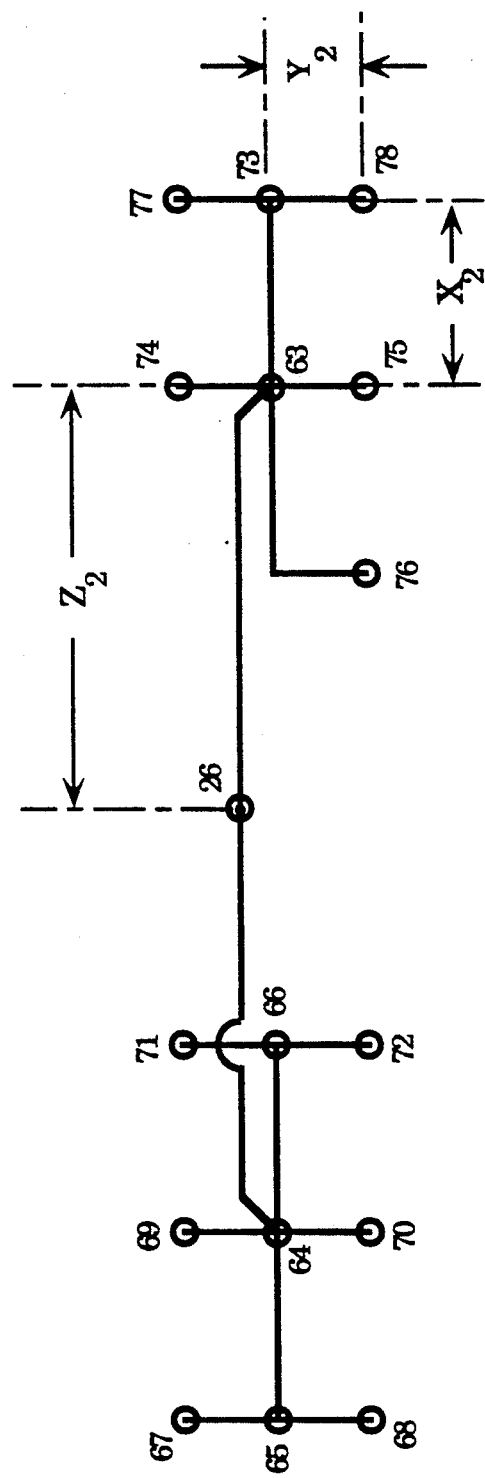
FIG. 8 illustrates another minimum trace length star cluster configuration of the alternate embodiment of the present invention with the lower trace capacitance than FIG. 5.

Referring now to FIG. 8, the topology of an alternate embodiment of the present invention is disclosed. The driving chip 26 is located in the center of sixteen VRAM chips 47-62 which are positioned as are the DRAM chips of FIG. 5 except two of the positions occupied by DRAM chips in FIG. 5 (42 and 36) are not occupied by VRAM chips in the alternate embodiment of the present invention. Furthermore, interconnections of the VRAM chips are different than those of the DRAM chips of FIG. 5. The driving chip 26 is connected electrically to two center VRAM chips 63 and 64.

One center VRAM chip 64 is connected electrically in the horizontal direction to the two closest VRAM chips in the horizontal direction 65 and 66. These VRAM chips 64-66 are each connected electrically in the vertical direction to the two closest VRAM chips in the vertical direction from each of the chips. That is to say: VRAM chip 65 is connected electrically to its two vertical neighbor VRAM chips 67 and 68; VRAM chip 64 is connected electrically to its two vertical neighbor VRAM chips 69 and 70; and VRAM chip 66 is connected electrically to its two vertical neighbor VRAM chips 71 and 72.

The other center VRAM chip 63 is connected electrically: in the horizontal direction to the closest VRAM chip in the horizontal direction 73; in the vertical direction to its two vertical direction neighboring VRAM chips 74 and 75; and to a horizontal and then vertical route to another VRAM chip 76. Furthermore VRAM chip 73 is connected electrically in the vertical direction to its two vertical neighbor VRAM chips 77 and 78. In the best mode implementation of the present invention, the distances X2, Y2 and Z2 correspond approximately to one inch, one-half inch and two inches, respectively.

The VRAM chip density can be increased by a factor of four by grouping the VRAMs together into two pair of clusters as depicted in FIG. 8. One pair of clusters is then placed on either side of the SIMM board with the driving chip located in the center of a pair of clusters on one side of the board. The VRAM chips on one side of the board are mirror images of the VRAM chips on the other side. This permits the VRAM chips to be mounted on the board so that the pins from one chip reside directly through the board from the corresponding pins of a mirror image VRAM chip. Minimum distance signal traces carry time critical signals from the driver to the signal input pins of the VRAM chips on the driver side of the board. These time critical signals are also conducted to the signal input pins of VRAM chips on the opposite side of the board by way of vias which pass through the multiple layers of the SIMM printed circuit board.

By connecting the VRAM chips to the on-board driving chip in this manner, the trace length to each of the VRAM chips (stub length) is minimized thereby decreasing the trace capacitance. It should be noted that in this implementation, the topology of FIG. 8 actually has approximately 2 inches less trace capacitance per cluster than the trace topology of FIG. 5.

Furthermore, because the topology of the routing to the RAMs is as symmetric as possible, the reflections will all return to the driver at closely the same time, which also contributes to the smoothness of the wave.

What is claimed is:

1. A computer memory module having at least one control signal, said at least one control signal synchronized by a clock pulse, said clock pulse having a rise time period wherein said clock pulse changes from a first voltage level to a second voltage level, said memory module comprising:
   a circuit board;
   a driving integrated circuit (IC) mounted to said circuit board, said driving IC for amplifying said at least one control signal;
   a plurality of random access memory (RAM) integrated circuits (ICs) for storing data, each said RAM IC mounted to said circuit board; and
   first coupling means for electrically coupling said driving IC to each said RAM IC, said first coupling means thereby providing said at least one control signal to each said RAM IC, said driving IC and said plurality of RAM ICs mounted on said circuit board in a pattern such that the distance from said driving IC to each said RAM IC is sufficiently short such that when said at least one control signal, driven by said driving IC, reflects back from each said RAM IC, said reflected at least one control signal combines with said at least one control signal within said rise time period thereby eliminating false triggers of said at least one control signal.

2. The memory module as set forth in claim 1 wherein said at least one control signal comprises a row address strobe (RAS) signal.

3. The memory module as set forth in claim 1 wherein said at least one control signal comprises a column address strobe (CAS) signal.

4. The memory module as set forth in claim 1 wherein said at least one control signal comprises a write enable (WE) signal.

5. The memory module as set forth in claim 1 wherein said circuit board has a first and second surface, and wherein said driving IC and said plurality of RAM ICs are mounted on said first surface, said circuit board further comprising:
   RAM means for storing data, said RAM means being mounted to said second surface;
   second coupling means for electrically coupling said first coupling means to said RAM means, said first and second coupling means together thereby providing said at least one control signal to said RAM means, said RAM means mounted on said circuit board such that the distance from said driving IC to said RAM means is sufficiently short such that when said at least one control signal, driven by said driving IC, reflects back from said RAM means, said reflected at least one control signal combines with said at least one control signal within said rise time period thereby eliminating false triggers of said at least one control signal.

6. The memory module as set forth in claim 5 wherein said RAM means comprises a plurality of second-side RAM ICs mounted on said second surface equal in number to the number of said RAM ICs mounted on said first surface, such that each of said second-side RAM IC has a corresponding RAM IC.

7. The memory module as set forth in claim 6 wherein each said second-side RAM IC is a mirror of its said corresponding RAM IC.

8. A computer memory module having at least one control signal, said at least one control signal synchronized by a clock pulse, said clock pulse having a rise time period wherein said clock pulse changes from a first voltage level to a second voltage level, said memory module comprising:

a circuit board, said circuit board having a first and second surface;

a driving integrated circuit (IC) mounted to said first surface, said driving IC for amplifying said at least one control signal;

a plurality of random access memory (RAM) integrated circuits (ICs) for storing data, each said RAM IC mounted to said first surface;

first coupling means for electrically coupling said driving IC to each said RAM IC, said first coupling means thereby providing said at least one control signal to each said RAM IC, said driving IC and said plurality of RAM ICs mounted on said circuit board in a pattern such that the distance from said driving IC to each said RAM IC is sufficiently short such that when said at least one control signal, driven by said driving IC, reflects back from each said RAM IC, said reflected at least one control signal combines with said at least one control signal within said rise time period;

RAM means for storing data, said RAM means mounted to said second surface;

second coupling means for electrically coupling said first coupling means to said RAM means, said first and second coupling means together thereby providing said at least one control signal to said RAM means, said RAM means mounted on said circuit board such that the distance from said driving IC to said RAM means is sufficiently short such that when said at least one control signal, driven by said driving IC, reflects back from said RAM means, said reflected at least one control signal combines with said at least one control signal within said rise time period.

9. The memory module as set forth in claim 8 wherein said at least one control signal comprises a row address strobe (RAS) signal.

10. The memory module as set forth in claim 8 wherein said at least one control signal comprises a column address strobe (CAS) signal.

11. The memory module as set forth in claim 8 wherein said at least one control signal comprises a write enable (WE) signal.

12. The memory module as set forth in claim 8 wherein said RAM mans comprises a plurality of second-side RAM ICs mounted on said second surface equal in number to the number of said RAM ICs mounted on said first surface, such that each of said second-side RAM IC has a corresponding RAM IC.

13. The memory module as set forth in claim 12 wherein each said second-side RAM IC is a mirror of its said corresponding RAM IC.

14. In a computer memory module having at least one control signal, said at least one control signal synchronized by a clock pulse, said clock pulse having a rise time period wherein said clock pulse changes from a first voltage level to a second voltage level, a method of eliminating false triggers of at least one control signal, said method comprising the steps of:

providing a circuit board;

mounting to said circuit board a driving integrated circuit (IC) for amplifying said at least one control signal;

mounting to said circuit board a plurality of random access memory (RAM) integrated circuits (ICs) for storing data; and coupling said driving IC to each said RAM IC thereby providing said at least one control signal to each said RAM IC, said driving IC and said plurality of RAM ICs being mounted on said circuit board in a pattern such that the distance from said driving IC to each said RAM IC is sufficiently short such that when said at least one control signal, driven by said driving IC, reflects back from each said RAM IC, said reflected at least one control signal combines with said at least one control signal within said rise time period.

15. The method as set forth in claim 14 wherein said at least one control signal comprises a row address strobe (RAS) signal.

16. The method as set forth in claim 14 wherein said at least one control signal comprises a column address strobe (CAS) signal.

17. The method as set forth in claim 14 wherein said at least one control signal comprises a write enable (WE) signal.

18. The method as set forth in claim 14 wherein said circuit board has a first and second surface, and wherein said driving IC and said plurality of RAM ICs are mounted on said first surface, said method further comprising the steps of:

mounting RAM means on said second surface, said RAM means for storing data;

coupling said driving IC to said RAM means thereby providing said at least one control signal to said RAM means, said RAM means mounted such that the distance from said driving IC to said RAM means is sufficiently short such that when said at least one control signal, driven by said driving IC, reflects back from said RAM means, said reflected at least one control signal combines with said at least one control signal within said rise time period.

19. The method as set forth in claim 18 wherein said RAM means comprises a plurality of second-side RAM ICs mounted on said second surface, equal in number to the number of said RAM ICs mounted on said first surface, such that each said second-side RAM IC has a corresponding RAM IC.

20. The method as set forth in claim 19 wherein each said second-side RAM IC is a mirror of its said corresponding RAM IC.

* * * * *